(12) United States Patent
Oh et al.

(10) Patent No.: US 12,033,865 B2
(45) Date of Patent: *Jul. 9, 2024

(54) RETAINING RING HAVING INNER SURFACES WITH FACETS

(71) Applicant: Applied Materials, Inc., Santa Clara, CA (US)

(72) Inventors: Jeonghoon Oh, Saratoga, CA (US); Steven M. Zuniga, Soquel, CA (US); Andrew J. Nagengast, Sunnyvale, CA (US); Samuel Chu-Chiang Hsu, Palo Alto, CA (US); Gautam Shashank Dandavate, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/198,337

(22) Filed: May 17, 2023

(65) Prior Publication Data

US 2023/0290645 A1    Sep. 14, 2023

Related U.S. Application Data

(63) Continuation of application No. 17/242,162, filed on Apr. 27, 2021, now Pat. No. 11,682,561, which is a
(Continued)

(51) Int. Cl.
*H01L 21/321* (2006.01)
*B24B 37/04* (2012.01)
(Continued)

(52) U.S. Cl.
CPC .......... *H01L 21/3212* (2013.01); *B24B 37/04* (2013.01); *B24B 37/32* (2013.01);
(Continued)

(58) Field of Classification Search
None
See application file for complete search history.

(56) References Cited

U.S. PATENT DOCUMENTS

| 3,038,279 | A | 6/1962 | Becker |
| 4,768,861 | A | 9/1988 | Epner |

(Continued)

FOREIGN PATENT DOCUMENTS

| CN | 1748293 | 3/2006 |
| CN | 201151081 | 11/2008 |

(Continued)

OTHER PUBLICATIONS

Machine Generated English Translation of the Bibdata for KR1020120095280. Published Aug. 28, 2012 (Year: 2012).*

(Continued)

*Primary Examiner* — Sylvia MacArthur
(74) *Attorney, Agent, or Firm* — Fish & Richardson P.C.

(57) ABSTRACT

A retaining ring comprises a generally annular body. The body comprises a top surface, a bottom surface, an outer surface connected to the top surface at an outer top perimeter and the bottom surface at an outer bottom perimeter, and an inner surface connected to the top surface at an inner top perimeter and the bottom surface at an inner bottom perimeter. The inner surface comprises seven or more planar facets. Adjacent planar facets are connected at corners. The inner bottom perimeter comprises straight edges of the planar facets connected at the corners.

15 Claims, 4 Drawing Sheets

Related U.S. Application Data continuation of application No. 15/018,443, filed on Feb. 8, 2016, now Pat. No. 11,056,350, which is a continuation of application No. 14/259,089, filed on Apr. 22, 2014, now Pat. No. 9,368,371.

(51) Int. Cl.
  *B24B 37/32* (2012.01)
  *B24B 41/06* (2012.01)
  B24B 37/10 (2012.01)
  H01L 21/304 (2006.01)
  H01L 21/306 (2006.01)

(52) U.S. Cl.
  CPC .............. *B24B 41/06* (2013.01); *B24B 37/10* (2013.01); *H01L 21/304* (2013.01); *H01L 21/30625* (2013.01)

(56) References Cited

U.S. PATENT DOCUMENTS

| | | | |
|---|---|---|---|
| 4,932,733 A | 6/1990 | Loy | |
| 4,993,791 A | 2/1991 | Burt et al. | |
| 5,695,392 A | 12/1997 | Kim | |
| 5,738,574 A | 4/1998 | Tolles et al. | |
| 6,068,548 A * | 5/2000 | Vote | B24B 37/30 451/287 |
| 6,183,354 B1 | 2/2001 | Zuniga et al. | |
| 6,251,215 B1* | 6/2001 | Zuniga | B24B 37/30 451/286 |
| 6,267,655 B1 | 7/2001 | Weldon et al. | |
| 6,436,228 B1 | 8/2002 | Zuniga et al. | |
| 6,663,468 B2 | 12/2003 | Kawamura et al. | |
| 6,857,945 B1 | 2/2005 | Chen et al. | |
| 6,913,669 B2 | 7/2005 | Ensinger | |
| 6,916,226 B2 | 7/2005 | Moloney et al. | |
| 7,575,504 B2 | 8/2009 | Zuniga et al. | |
| 7,740,521 B2 | 6/2010 | Hashimoto | |
| 8,328,454 B2 | 12/2012 | McAndrews et al. | |
| 8,388,412 B2 | 3/2013 | Prabhu | |
| 8,870,626 B2 | 10/2014 | Wang | |
| 9,152,902 B2 | 10/2015 | Timm et al. | |
| 9,368,371 B2 | 6/2016 | Oh et al. | |
| 10,500,695 B2* | 12/2019 | Reedy | H01L 21/68721 |
| 11,056,350 B2 | 7/2021 | Oh et al. | |
| 11,400,560 B2* | 8/2022 | Oh | B24B 37/32 |
| 2001/0007795 A1 | 7/2001 | Kawamura et al. | |
| 2001/0051500 A1 | 12/2001 | Homma et al. | |
| 2003/0162486 A1 | 8/2003 | Stoeckgen et al. | |
| 2003/0224703 A1 | 12/2003 | Moloney et al. | |
| 2004/0011293 A1 | 1/2004 | Johnson et al. | |
| 2004/0152403 A1 | 8/2004 | Marohl et al. | |
| 2004/0203325 A1 | 10/2004 | Donohue | |
| 2005/0113002 A1 | 5/2005 | Chen et al. | |
| 2005/0126708 A1* | 6/2005 | Chen | B24B 37/32 156/345.14 |
| 2006/0046621 A1 | 3/2006 | Phang | |
| 2007/0044913 A1 | 3/2007 | Wang et al. | |
| 2008/0090497 A1 | 4/2008 | Wang | |
| 2009/0021024 A1 | 1/2009 | Prabhu | |
| 2010/0035523 A1 | 2/2010 | Shirasu | |
| 2010/0120335 A1 | 5/2010 | Fang et al. | |
| 2011/0151755 A1 | 6/2011 | Burns et al. | |
| 2012/0041458 A1 | 2/2012 | Paganon | |
| 2012/0309276 A1 | 12/2012 | Kim | |
| 2013/0035022 A1* | 2/2013 | Paik | B24B 37/32 451/364 |
| 2013/0115858 A1 | 5/2013 | Zuniga et al. | |
| 2013/0165028 A1 | 6/2013 | Sather et al. | |
| 2013/0324017 A1 | 12/2013 | Rahmathullah et al. | |
| 2014/0123469 A1* | 5/2014 | Han | B29D 99/0082 29/525.02 |
| 2014/0134929 A1 | 5/2014 | Lien et al. | |
| 2014/0287662 A1 | 9/2014 | Rahmathullah | |
| 2015/0303070 A1 | 10/2015 | Oh et al. | |
| 2016/0151879 A1 | 6/2016 | Oh | |
| 2016/0243670 A1 | 8/2016 | Fukushima et al. | |
| 2016/0271750 A1 | 9/2016 | Hu et al. | |
| 2016/0346897 A1 | 12/2016 | Reedy et al. | |
| 2017/0120414 A1 | 5/2017 | Tsai et al. | |
| 2018/0264621 A1 | 9/2018 | Yoo | |
| 2019/0099857 A1 | 4/2019 | Oh | |
| 2020/0114489 A1 | 4/2020 | Reedy et al. | |
| 2020/0130134 A1 | 4/2020 | Chen et al. | |
| 2020/0398399 A1 | 12/2020 | Chen et al. | |
| 2021/0249276 A1 | 8/2021 | Oh et al. | |
| 2023/0019815 A1 | 1/2023 | Reedy et al. | |
| 2023/0290645 A1* | 9/2023 | Oh | H01L 21/3212 451/287 |

FOREIGN PATENT DOCUMENTS

| | | | |
|---|---|---|---|
| CN | 101331003 | 12/2008 | |
| CN | 201346739 | 11/2009 | |
| CN | 101987430 | 3/2011 | |
| CN | 201856158 | 6/2011 | |
| CN | 107953242 | 4/2018 | |
| DE | 2722646 | 12/1977 | |
| GB | 2065323 | 12/1979 | |
| JP | S52-125188 | 10/1977 | |
| JP | H07-237121 | 9/1995 | |
| JP | H08-187657 | 7/1996 | |
| JP | 2000-288923 | 10/2000 | |
| JP | 2001-345297 | 12/2001 | |
| JP | 2002-326146 | 11/2002 | |
| JP | 2002-326156 | 11/2002 | |
| JP | 3098671 | 10/2003 | |
| JP | 2004-056110 | 2/2004 | |
| JP | 2005-005398 | 1/2005 | |
| JP | 2008-511983 | 4/2008 | |
| JP | 2009-050943 | 3/2009 | |
| JP | 2010-036283 | 2/2010 | |
| KR | 10-2006-0050785 | 5/2006 | |
| KR | 10-2008-0109119 | 12/2008 | |
| KR | 1020120095280 * | 8/2012 | ............ B24B 37/32 |
| KR | 101224539 A * | 1/2013 | ............ B24B 37/32 |
| TW | M493229 | 7/2002 | |
| TW | 200609078 | 3/2006 | |
| TW | 201039976 | 11/2010 | |
| WO | WO 2004/023937 | 3/2004 | |
| WO | WO 2006/025641 | 3/2006 | |

OTHER PUBLICATIONS

Machine Generated English Translation of the Claims for KR1020120095280. Published Aug. 28, 2012 (Year: 2012).*
Machine Generated English Translation of the Description for KR1020120095280. Published Aug. 28, 2012 (Year: 2012).*
European Search Report in European Appln. No. 16804163.0, dated Nov. 30, 2018, 9 pages.
International Search Report and Written Opinion in International Appln. No. PCT/US2015/026004, dated Jul. 27, 2015, 13 pages.
Machine English Translation of KR101224539 Published Jan. 21, 2013.
Machine Generated English Translation of Abstract of KR101224539. Published Jan. 21, 2013. (Year: 2013).
Machine Generated English Translation of Claims of JP08187657. Published Jul. 23, 1996 (Year: 1996).
Machine Generated English Translation of Claims of KR101224539. Published Jan. 21, 2013. (Year: 2013).
Machine Generated English Translation of JP08187657. Published Jul. 23, 1996 (Year: 1996).
Machine Generated English Translation of KR10-1224539; Published Jan. 21, 2013. (Year: 2013).
Machine Generated English Translation of Specification of KR101224539. Published Jan. 21, 2013. (Year: 2013).
Office Action in Chinese Appln. No. 201580021182.3, dated Apr. 17, 2019, 14 pages (with English translation).
Office Action in Chinese Appln. No. 201580021182.3, dated Sep. 28, 2018, 14 pages (English Translation).

(56) References Cited

OTHER PUBLICATIONS

Office Action in Chinese Appln. No. 201580021182.3, dated Oct. 21, 2019, 5 pages (with English translation).
Office Action in Chinese Appln. No. 202010266127.3, dated Feb. 9, 2022, 5 pages (with English translation).
Office Action in Chinese Appln. No. 202010266127.3, dated May 14, 2021, 18 pages (with English translation).
Office Action in Japanese Appln. No. 2016-564001, dated Jan. 29, 2019, 12 pages (with English translation).
Office Action in Japanese Appln. No. 2016-564001, dated Feb. 10, 2020, 10 pages (with English translation).
Office Action in Japanese Appln. No. 2016-564001, dated Sep. 10, 2019, 5 pages (with English translation).
Office Action in Japanese Appln. No. 2017-556245, dated May 12, 2020, 30 pages (with English translation).
Office Action in Korean Appln. 10-2016-7032464, dated Apr. 20, 2021, 11 pages (with English translation).
Office Action in Korean Appln. 10-2016-7032464, dated Oct. 26, 2021, 6 pages (with Machine translation).
Office Action in Taiwanese Appln. No. 104112243, dated Jan. 16, 2019, 16 pages (with English translation).
Office Action in Taiwanese Appln. No. 105116687, dated May 22, 2019, 10 pages (with English Search Report).
Office Action in Taiwanese Appln. No. 108112609, dated May 14, 2020, 12 pages (with English Search Report).
Office Action in Taiwanese Appln. No. 108112609, dated Oct. 24, 2019, 13 pages (with English search report).
Supplementary Examination Report in Singapore Appln. No. 11201608293Y, dated Nov. 12, 2019, 2 pages.
Zheng et al., "Design of Universal Fixture for Planetary Grinding and Polishing Machine," Mechanical & Electrical Technology, Jun. 30, 2010, 2: 55-56, 65 (with machine translation of Abstract).

\* cited by examiner

RETAINING RING HAVING INNER SURFACES WITH FACETS

CROSS-REFERENCE TO RELATED APPLICATIONS

This application is a continuation of U.S. patent application Ser. No. 17/242,162, filed Apr. 27, 2021, which is a continuation of U.S. patent application Ser. No. 15/018,443, filed Feb. 8, 2016, which is a continuation of U.S. patent application Ser. No. 14/259,089, filed Apr. 22, 2014, the entire disclosures of which are incorporated by reference.

TECHNICAL FIELD

The present disclosure relates generally to chemical mechanical polishing of substrates, and more particularly to retaining rings for use in chemical mechanical polishing.

BACKGROUND

An integrated circuit is typically formed on a substrate by the sequential deposition of conductive, semiconductive or insulative layers on a silicon substrate. One fabrication step involves depositing a filler layer over a non-planar surface, and planarizing the filler layer until the non-planar surface is exposed. For example, a conductive filler layer can be deposited on a patterned insulative layer to fill the trenches or holes in the insulative layer. The filler layer is then polished until the raised pattern of the insulative layer is exposed. After planarization, the portions of the conductive layer remaining between the raised pattern of the insulative layer form vias, plugs and lines that provide conductive paths between thin film circuits on the substrate. In addition, planarization may be needed to planarize a dielectric layer at the substrate surface for photolithography.

Chemical mechanical polishing (CMP) is one accepted method of planarization. This planarization method typically requires that the substrate be mounted on a carrier or polishing head of a CMP apparatus. The exposed surface of the substrate is placed against a rotating polishing disk pad or belt pad. The polishing pad can be either a "standard" pad or a fixed-abrasive pad. A standard pad has a durable roughened surface, whereas a fixed-abrasive pad has abrasive particles held in a containment media. The carrier head provides a controllable load on the substrate to push it against the polishing pad. A polishing slurry, including at least one chemically-reactive agent, and abrasive particles if a standard pad is used, is supplied to the surface of the polishing pad.

The substrate is typically retained below the carrier head by a retaining ring. However, because the retaining ring contacts the polishing pad, the retaining ring tends to wear away, and is occasionally replaced. Some retaining rings have an upper portion formed of metal and a lower portion formed of a wearable plastic, whereas some other retaining rings are a single plastic part.

SUMMARY

In one aspect, the disclosure features a retaining ring comprising a generally annular body. The body comprises a top surface, a bottom surface, an outer surface connected to the top surface at an outer top perimeter and the bottom surface at an outer bottom perimeter, and an inner surface connected to the top surface at an inner top perimeter and the bottom surface at an inner bottom perimeter. The inner surface comprises seven or more planar facets. Adjacent planar facets are connected at corners. The inner bottom perimeter comprises straight edges of the planar facets connected at the corners.

In another aspect, the disclosure features a carrier head comprising a substrate receiving surface and a generally annular retaining ring surrounding the substrate receiving surface. The retaining ring comprises a top surface, a bottom surface, an outer surface connected to the top surface at an outer top perimeter and the bottom surface at an outer bottom perimeter, and an inner surface connected to the top surface at an inner top perimeter and the bottom surface at an inner bottom perimeter. The inner surface comprises seven or more planar facets. Adjacent planar facets are connected at corners. The inner bottom perimeter comprises straight edges of the planar facets connected at the corners.

In another aspect, the disclosure features a method of polishing comprising creating a relative motion between a substrate and a polishing surface and restraining the substrate with a retaining ring. The retaining ring comprises a top surface, a bottom surface, an outer surface connected to the top surface at an outer top perimeter and the bottom surface at an outer bottom perimeter, and an inner surface connected to the top surface at an inner top perimeter and the bottom surface at an inner bottom perimeter. The inner surface comprises seven or more planar facets. Adjacent planar facets are connected at corners. The inner bottom perimeter comprises straight edges of the planar facets connected at the corners. The relative motion between the substrate and the polishing surface causes the retained substrate to contact two or more facets of the inner surface of the retaining ring simultaneously.

Embodiments of the retaining rings, the carrier heads, and the methods may also include one or more of the following features. The bottom surface comprises channels extending from the outer surface to the inner surface, and each channel comprises an end open to the inner surface of the body at a corner. The inner surface comprises a first number of facets and the bottom surface comprises a second number of channels. The first number is a positive integer times the second number. The first number equals the second number. The channels are oriented at an angle relative to a radial segment extending through a center of the retaining ring. Each corner extends from the top surface to the bottom surface. Each facet has a rectangular or square shape having a top straight edge formed with the top surface, a bottom straight edge formed with the bottom surface, and two straight side edges along two corners. The inner surface comprises a total of 18 facets. The inner bottom perimeter has a symmetric shape. One or both of the inner top perimeter and the inner bottom perimeter forms a polygon. A distance between a center of the retaining ring and a planar facet is about 150 mm to about 155 mm. The body comprises a wearable material. A polishing liquid is supplied to the polishing surface so that the polishing liquid flows through the channels in the bottom surface and beneath the retaining ring to the substrate.

The details of one or more embodiments of the invention are set forth in the accompanying drawings and the description below. Other features, objects, and advantages of the invention will be apparent from the description and drawings, and from the claims.

DETAILED DESCRIPTION

A retaining ring in a CMP apparatus has an inner surface that confines movement of a substrate being polished by the CMP apparatus. In a conventional retaining ring, the inner surface has a circular perimeter.

The retaining ring described herein has an inner surface formed of multiple planar facets, with adjacent facets joined at corners. In a top or bottom planar view of the retaining ring, the facets of the inner surface form a polygon or other shapes having straight edges. The retaining ring can also include channels in a bottom surface that faces a polishing pad when the retaining ring is assembled in the CMP apparatus. The channels can facilitate transporting slurry between the substrate and the polishing pad. The locations of the facets and the channels can be chosen such that each channel has an end open to the inner surface of the retaining ring at a corner of the retaining ring. In use, the retaining ring having these features, and other features described below, can be in contact with multiple points of the outer diameter of the substrate simultaneously. The retaining ring resists wear and has a long life expectancy. The polished substrate can have good thickness uniformity.

Figure 1:
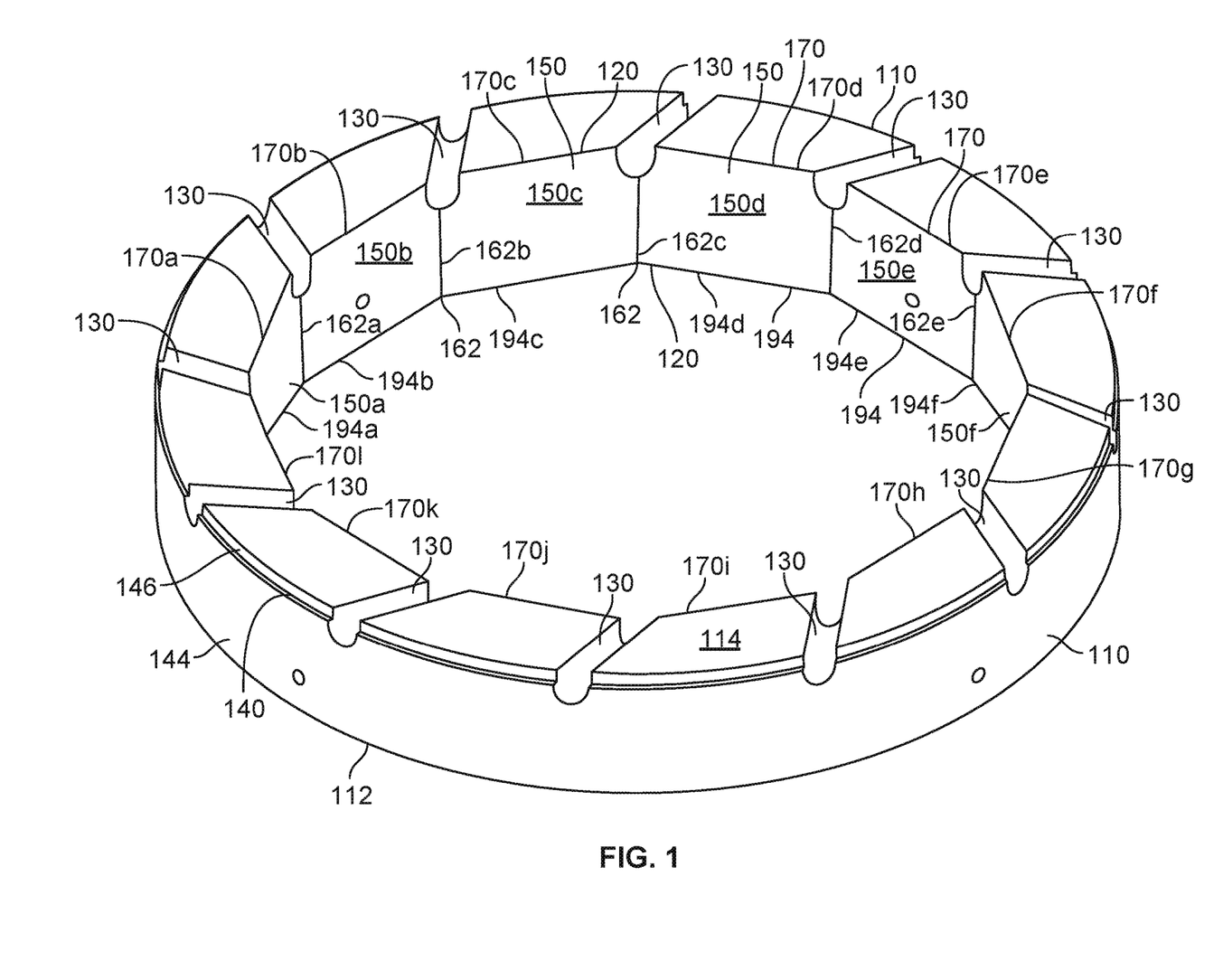
FIG. 1 is a schematic perspective view of a retaining ring.

Referring to FIG. 1, a retaining ring 100 is a generally an annular ring that can be secured to a carrier head of a CMP apparatus. A suitable CMP apparatus is described in U.S. Pat. No. 5,738,574 and a suitable carrier heads are described in U.S. Pat. Nos. 6,251,215, and 6,857,945, the entire disclosures of which are incorporated herein by reference. The retaining ring 100 fits into a loadcup for positioning, centering, and holding the substrate at a transfer station of the CMP apparatus.

Figure 2:
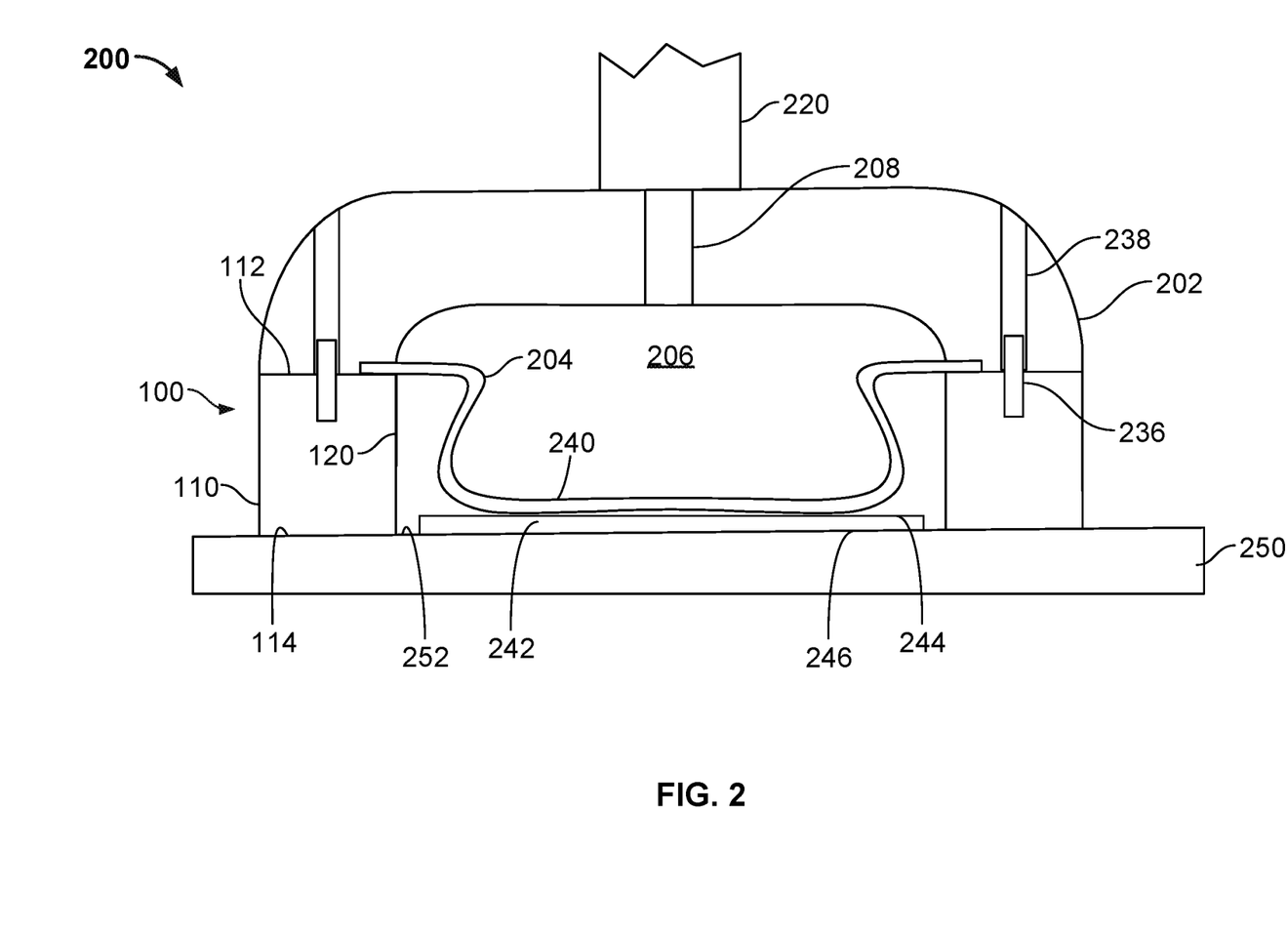
FIG. 2 is a schematic cross-sectional view of a carrier head.

As an example, FIG. 2 shows a simplified carrier head 200 onto which the retaining ring 100 of FIG. 1 is secured. The carrier head 200 includes a housing 202, a flexible membrane 204, a pressurizable chamber 206, and the retaining ring 100. The flexible membrane provides a mounting surface 240 for a substrate 242. When the substrate 242 is mounted, the mounting surface 240 can directly contact a back surface 244 of the substrate. In this example, the membrane 204 is clamped between the retaining ring 100 and the housing 202. In some implementations, one or more other parts, e.g., clamp rings, can be used to hold the membrane 204. The pressurizable chamber 206 is located between the membrane 204 and the housing 202 can be pressurized, e.g., using a fluid (gas or liquid), to push a front surface 246 of the substrate 242 against a polishing surface 252 of a polishing pad 250 to polish the front surface 246. In some implementations, the pressure in the chamber 206, and thus the downward pressure of the flexible membrane 204 on the substrate 242, can be controlled using a pump (not shown) that is fluidly connected to the chamber 206 though a passage 208 in the housing.

The retaining ring 100 is secured near the edge of the housing 202 to confine the substrate 242 below the membrane 204. For example, the retaining ring 100 can be secured by mechanical fasteners 236, e.g., screws or bolts, that extend through passages 238 in the housing 202 into aligned threaded receiving recesses in an upper surface 112 of the retaining ring 100. Additionally, the top surface 112 can have one or more alignment apertures positioned to mate to a corresponding pin on the carrier head to allow proper alignment when the retaining ring 100 is secured to the carrier head. When the retaining ring 100 is secured to the housing 202, the circumference of the top of the top surface 112 can be substantially the same as the circumference of the housing 202 so that no gap exists along an outer edge of the carrier head. The retaining ring 100 is removable from the housing 202 and the rest of the carrier head 200 as a unit, without requiring disassembling the housing 202 or removing the housing 202 from the carrier head 200.

A drive shaft 220 can be provided to rotate and/or translate the carrier head 200 across a polishing pad. In some implementations, the drive shaft 220 can be raised and lowered to control the pressure of a bottom surface 114 of the retaining ring 100 on the polishing pad 250. Alternatively, the retaining ring 100 can be movable relative to the drive shaft 220 and the carrier head 200 can include an internal chamber which can be pressurized to control a downward pressure on the retaining ring 100, e.g., as described in U.S. Pat. No. 6,183,354 or 7,575,504, which are incorporated by reference.

Figure 3:
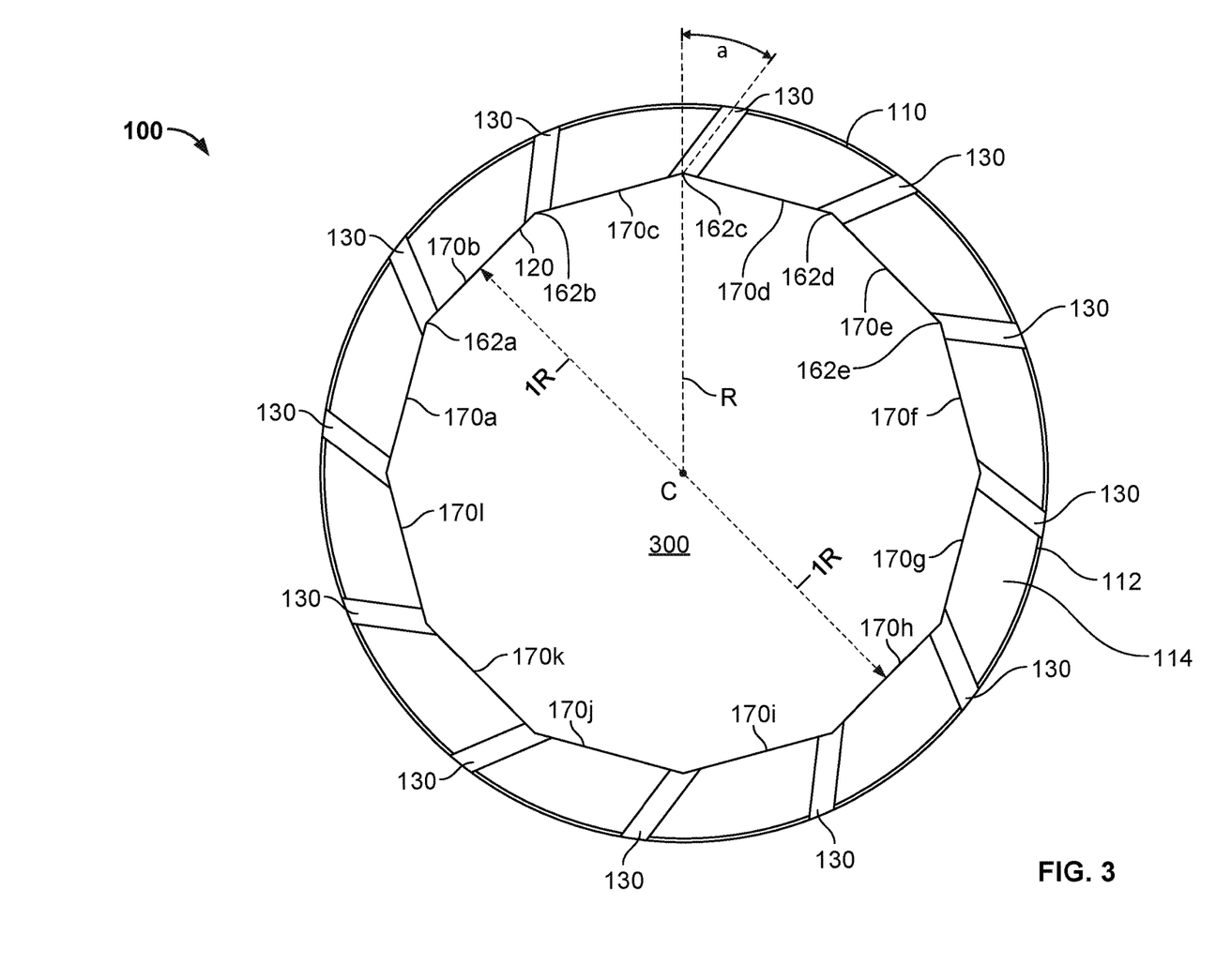
FIG. 3 is a schematic planar bottom view of the retaining ring of FIG. 1.

Referring to FIGS. 1 and 3, the upper surface 112 of the retaining ring 100 is flat and a lower surface 114 contains channels or grooves 130. Other than the channels 130, the lower surface 114 can be flat and can be parallel to the upper flat surface 112. In this example, the lower surface 114 includes twelve channels 130, although there can be a different number of channels, e.g., eighteen or more channels. When the retaining ring 100 is assembled in a carrier head, such as the carrier head shown in FIG. 2, the lower surface 114 contacts the polishing pad. The channels 130 permit a polishing fluid, such as slurry, which can include abrasives or be abrasive-free, to flow underneath the retaining ring to the substrate.

The upper surface 112 and the lower surface 114 can be separated by a distance, or the height of the retaining ring, of about 12.5 mm to about 37.5 mm. The channels 130 can be generally straight, and extend from an inner surface 120 to an outer surface 110 of the retaining ring 100. Each channel 130 can have a width W (see, FIG. 4) of about 0.75 mm to about 25 mm, e.g., about 3.125 mm.

The channels 130 on the bottom surface 114 can be distributed at equal angular intervals around the retaining ring 100. The channels 130 are typically oriented at an angle α, e.g., between about 30° to about 60°, or about 45°, relative to a radial segment (R) extending through the center of the retaining ring 100.

Figure 4:
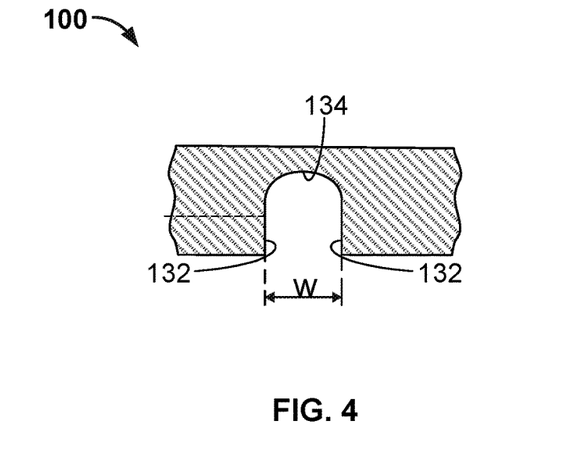
FIGS. 4 and 5 are cross-sectional views of retaining rings.

Referring to FIG. 4, each channel 130 includes two vertical sidewalls 132 and a rounded ceiling 134, so that the channel 130 lacks sharp inner corners. For example, the rounded ceiling 134 can have a semicircular cross-section with a diameter equal to the distance between the two sidewalls 132. The two vertical sidewalls 132 can have the same height, e.g., of about 0.5 mm to about 3.75 mm. The vertical sidewalls 132 can have a rounded or sharp junction with the ceiling 134. As another example, shown in FIG. 5, the ceiling of the groove could have a generally horizontal flat section 136, and the curvature 138 could be located just the corners where the ceiling intersects the sidewalls.

Referring again to FIGS. 1 and 3, at least the portion of the outer surface 110 of the retaining ring 100 adjacent the lower surface 114 can be a vertical cylindrical surface having a circular shape in a top or bottom planar view. In some implementations, the retaining ring 100 includes an overhanging portion 146 that has a larger outer diameter than a bottommost portion 144, so that the outer surface 110 includes a ledge 140.

Instead of a cylindrical surface, the inner surface 120 is formed of multiple facets 150, including facets 150a, 150b, 150c, 150d, 150e, 150f (not all shown), each being a flat vertical surface and joining an adjacent facet at a corner, e.g., the corners 162, including 162a, 162b, 162c, 162d, 162e (not all shown or labeled). Thus, each corner 162 can be a straight vertical corner.

The facets intersect the upper and lower surfaces 112, 114 along straight upper and lower edges 170 and 194, respectively. The straight edges of the facets connect to one another at the corners. Thus, in a top or bottom planar view, the connected edges can form a polygon.

In the example of FIG. 1, the inner surface 120 has twelve facets 150 that form twelve lower, straight edges 170, including edges 170a, 170b, 170c, 170d, 170e, 170f, 170g, 170h, 170i, 170j, 170k, 170l, with the lower surface 114 and twelve upper, straight edges 194, including edges 194a, 194b, 194c, 194d, 194e, 194f (not all shown). However, there the retaining ring 100 could have 12 to 148 facets.

On average, the inner surface 120 and the outer surface 110 are separated by a distance, or an average width of the retaining ring 100, of about 2.5 cm to about 5.0 cm.

Each channel 130 in the upper surface 114 has an end open to the inner surface 120 and an opposite end open to the outer surface 110. The openings in the inner surface 120 are located at the corners between adjacent facets. In some implementations, all openings of the channels 130 in the inner surface 120 are located at the corners and no openings of the channels 130 in the inner surface 120 are between two corners along an edge of a facet. In the example shown in the figures, each corner corresponds to one opening of a channel, and therefore, a channel 130. The total number of facets in the inner surface 120 can equal the total number of channels in the lower surface 114. In some implementations, the number of facets in the inner surface equals an integer, e.g., 1, 2, 3, . . . , times the total number of channels. For example, a channel opening, and therefore, a channel 130, may be formed every two, three, or more corners on the inner surface 120.

The inner surface 120 of the retaining ring 100, in conjunction with the lower surface 240 of the flexible membrane 204, defines a substrate receiving recess 300. The retaining ring 100 prevents the substrate 242 from escaping the substrate receiving recess 300. Generally, the substrate is circular and has a diameter of about 200 mm to about 300 mm. The size of the recess 300 in a top or bottom planar view is generally larger than surface area of the substrate 242 such that the substrate 242 can move its position relative to the retaining ring 100. For the purpose of discussion, an inner radius (IR) of the retaining ring 100 is defined in the planar view of the retaining ring to be a distance between the center C of the retaining ring 100 to a center point on an edge of a facet between two adjacent corners. The inner radius is larger than half of the substrate diameter, or the substrate radius, and can be e.g., of about 150 mm to about 155 mm.

Figures 5, 6:
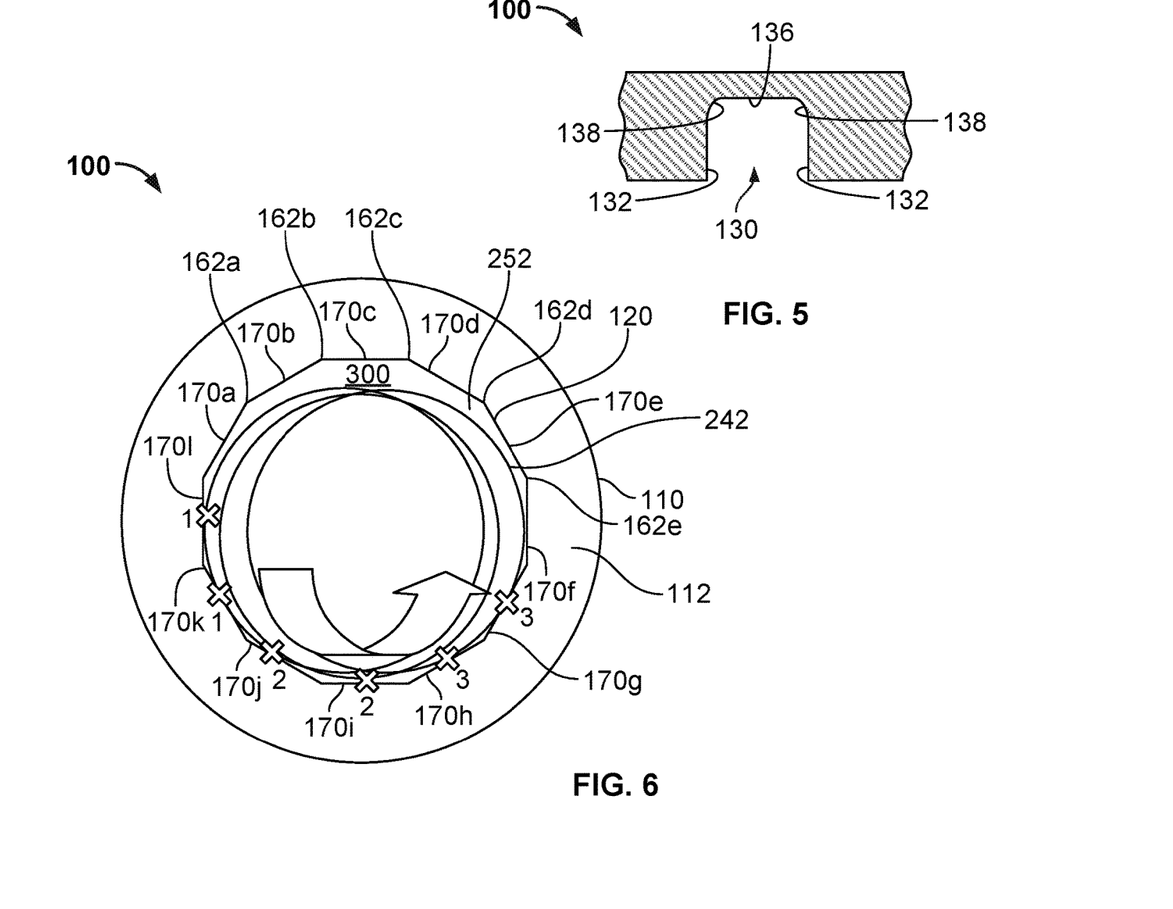
FIG. 6 is a schematic planar top view of a retaining ring with a retained substrate at different positions relative to the retaining ring.

Referring to FIGS. 2 and 6, during a polishing process, the carrier head 200, including the housing 202, the membrane 204, and the retaining ring 100, moves relative to the polishing pad 250. The substrate 242 follows the movement of the carrier head 200 within the recess 300 defined by the inner surface 120 of the retaining ring 100 and the membrane 204. At a certain time moment during the movement, the substrate 242 contacts at least two facets of the inner surface 120. For example, as shown in FIG. 6, at a time moment when the substrate 242 is in a contacting position "1" relative to the retaining ring, the outer surface of the substrate simultaneously makes one contact with the facet 170k and another contact with the facet 170l (the contact locations are indicated by a symbol "x" and labeled with the position "1").

Assuming that at the two contact locations, the substrate 242 does not slip with respect to the inner surface 120 of the retaining ring 100, at the two contact locations, the substrate 242 and the inner surface 120 have the same linear velocity. However, because the radius of the substrate 242 is smaller than the radius of the inner surface 120 of the retaining ring 100, at the two contact locations, the substrate 242 and the inner surface 120 have different angular velocities. As a result, after this moment in which the substrate 242 is at the contacting position "1", the position of the substrate 242 relative to the retaining ring 100 changes and the contact locations between the substrate 242 and the inner surface 120 change. In other words, the center of the substrate 242 moves, e.g., rotates, relative to the center of the retaining ring. For example, at another moment, the substrate 242 is in a contacting position "2" relative to the retaining ring. In this position "2", the outer surface of the substrate 242 simultaneously makes one contact with the facet 170i and another contact with the facet 170j. At yet another moment, the substrate 242 is in a contacting position "3" relative to the retaining ring. In this position "3", the outer surface of the substrate makes one contact with the facet 170h and another contact with the facet 170g.

Although FIG. 6 shows that the substrate 242 is simultaneously in contact with two facets at each contacting position, e.g., the position "1", "2", or "3", it is possible that the substrate 242 simultaneously contacts more than two facets, e.g., three or more facets, at each contacting position. For example, the number of contacting facets at each contacting position can be controlled by controlling the total number and/or shape of facets in the inner surface 120 of the retaining ring, the radius difference between the substrate 242 and the inner surface 120, etc.

In some examples, each facet can have the same dimensions and shape, and the planar view of the inner surface 120 can be highly symmetric. In other examples, the facets can have different dimensions or shapes, and the cross-section of the inner surface can be non-symmetric. For example, although the figures show that the facets are generally rectangular or square, the facets can also have other shapes, e.g., trapezoid. The corners shown in the figures extend from the upper surface 112 to the bottom surface 114. In other examples, some corners between two adjacent facets do not extend fully between the two surfaces 112, 114.

By allowing the substrate 242 to be simultaneously in contact with multiple facets at each contacting position, the wear of the inner surface 120 of the retaining ring can be reduced as compared to forming a single contact at each contacting position. For example, when an inner surface of a retaining ring is cylindrical, e.g., like the outer surface 110 of the retaining ring 100, at each contacting position, a substrate having a circular outer perimeter contacts the inner surface at a single contacting location. The multiple contacts can allow force between the substrate 242 and the inner surface 120 to be absorbed at the multiple contacting locations and reduce the wear caused by the force at each individual contacting location. Furthermore, the contact angle in the single contact between a substrate and a cylindrical surface is normal to the inner diameter of the cylindrical surface. However, when the substrate 242 makes multiple contacts with the inner surface 120 at multiple facets, the contact angles are not necessarily normal to the inner radius of the inner surface 120. As a result, the wear on the retaining ring at each contact location is reduced as compared to a contact having a contact angle of 90 degrees. The reduced wear can allow the retaining ring to have an increased life expectancy.

During the relative movement between the retaining ring 100 and the substrate 242, the substrate makes no direct point-to-point contact with any of the channels 130 or channel openings located at the corners of the inner surface 120. Instead, the substrate only makes point-to-surface contacts with the facets of the inner surface 120. Generally, the channels 130 form high stress areas in the retaining ring 100, where the retaining ring tends to be damaged or break more easily than other parts of the ring. By eliminating direct point-to-point contacts between the channels 130 and the substrate 242, the high stress areas are protected from direct impact of the force between the substrate 242 and the inner surface 120. The possible damages to the retaining ring from such force are reduced. As a result, the wear of the retaining ring is reduced and the retaining ring can be used for a long period of time.

In some polishing processes, the relative movement between the substrate 242 and the retaining ring 100 can reduce asymmetry in a polished substrate and improve within-wafer uniformity. In a polished substrate with asymmetry, the polished substrate has a thickness variation that varies with the angular coordinate. Without being limited to any particular theory, as compared to a single contact situation, the multiple contacts between the substrate 242 and the retaining ring 100 can allow the substrate 242 to rotate to the carrier head, thus angularly spreading the effect of any asymmetric pressure distribution from the carrier head, and thereby reducing the chance of asymmetry occurrence or the amount of asymmetry.

The retaining ring 100 can be formed from a material that is chemically inert to the CMP process. The material should be sufficiently elastic that contact of the substrate edge against the retaining ring 100 does not cause the substrate to chip or crack. However, the retaining ring 100 should not be so elastic as to extrude into the substrate receiving recess 300 when the carrier head puts a downward pressure on the retaining ring 100. The retaining ring 100 should also be durable and have a low wear rate, although it is acceptable for the retaining ring 100 to wear away.

For example, the retaining ring 100 can be made of a plastic that is chemically inert in a CMP process. The plastic can have a durometer measurement of about 80-95 on the Shore D scale. In general, the elastic modulus of the plastic can be in the range of about $0.3$-$1.0 \times 10^6$ psi. Suitable plastic can include (e.g., consist of) polyphenylene sulfide (PPS), polyaryletherketone (PAEK), polyetheretherketone (PEEK), polyethylene terephthalate (PET), polybutylene terephthalate (PBT), polytetrafluoroethylene (PTFE), polybenzimidazole (PBI), polyetherimide (PEI), polyetherketoneketone (PEKK), or a composite material. An advantage of polyphenol sulfide (PPS) is that it is reliable and commonly used material for retaining rings.

The retaining ring 100 can also have other features or features alternative to those discussed above. In some implementations, the retaining ring 100 has one or more through holes that extend horizontally or at a small angle from horizontal through the body of the retaining ring from the inner surface to the outer surface for allowing fluid, e.g., gas or liquid, to pass from the interior to the exterior, or from the exterior to the interior, of the retaining ring during polishing. The through-holes can be evenly spaced around the retaining ring.

Although the side walls of the retaining ring 100 are illustrated as being vertical, the retaining ring 110 can include other features, such as a lip or recess on the outer surface to assist with centering the retaining ring in a substrate loader or to provide a hard stop for the retaining ring against the top inner edge of a surrounding ring. In some implementations, the inner surface and/or outer surface of the retaining ring 100 can be tapered.

Although the retaining ring described above contains a single ring, in some implementations, a retaining ring can have a combination of two or more ring portions stacked on top of each other. In such implementations, the retaining ring 100 described above can be the lowest ring portion having its lower surface in contact with a polishing pad. Certain parts of the retaining ring 100 may be altered to connect to the other ring portions.

Other features related to retaining rings and retaining ring portions are described in U.S. Patent Application Publication No. 2005/0126708 and U.S. Patent Application Publication No. 2013/0035022. The entire contents of both applications are incorporated herein by reference.

Other features are in the claims.

What is claimed is:

1. A method of polishing, comprising:
bringing a substrate into contact with a polishing pad;
creating relative motion between the substrate and the polishing pad; and
retaining the substrate with a retaining ring that includes
a generally annular body comprising
a top surface configured attached to a chemical mechanical polishing carrier head,
a bottom surface formed of a plastic suitable for contacting the polishing pad,
an outer surface connected to the top surface at an outer top perimeter and the bottom surface at an outer bottom perimeter, and
an inner surface formed of the plastic to laterally restrain the substrate, the inner surface connected to the top surface at an inner top perimeter and the bottom surface at an inner bottom perimeter, the inner surface comprising 12 to 148 planar facets, adjacent planar facets being connected at corners, and the inner bottom perimeter comprising straight edges of the planar facets, the straight edges of the adjacent planar facets connected at the corners such that the inner bottom perimeter defines a closed polygon, and wherein the bottom surface, outer surface and inner surface having the planar facets are surfaces of a single solid closed ring.

2. The method of claim 1, wherein the bottom surface comprises channels extending from the outer surface to the inner surface, and wherein each channel comprises an end open to the inner surface of the body at a same location relative to a nearest corner.

3. The method of claim 2, wherein the inner surface comprises a first number of facets and the bottom surface comprises a second number of channels, and wherein the first number is a positive integer times the second number.

4. The method of claim 3, wherein the first number equals the second number.

5. The method of claim 2, wherein the channels are oriented at an angle relative to a radial segment extending through a center of the retaining ring.

6. The method of claim 1, wherein each corner extends from the top surface to the bottom surface, and wherein each facet has a rectangular or square shape having a top straight edge formed with the top surface, a bottom straight edge formed with the bottom surface, and two straight side edges along two corners.

7. The method of claim 1, wherein the inner bottom perimeter has a symmetric shape.

8. The method of claim 1, wherein the inner top perimeter forms a polygon.

9. The method of claim 1, wherein a distance between a center of the retaining ring and a planar facet is about 150 mm to about 155 mm.

10. The method of claim 1, wherein the body comprises a wearable material.

11. The method of claim 1, wherein the facets are at equal angular intervals around the inner surface.

12. The method ring of claim 1, wherein the facets have the same shape.

13. The method of claim 1, wherein the facets are perpendicular to the bottom surface.

14. The method of claim 1, wherein the straight edges have the same length.

15. The method of claim 1, wherein the facets are rectangular.

* * * * *

UNITED STATES PATENT AND TRADEMARK OFFICE
CERTIFICATE OF CORRECTION

PATENT NO. : 12,033,865 B2
APPLICATION NO. : 18/198337
DATED : July 9, 2024
INVENTOR(S) : Jeonghoon Oh et al.

It is certified that error appears in the above-identified patent and that said Letters Patent is hereby corrected as shown below:

In the Claims

In Column 9, Line 18, Claim 12, delete "method ring" and insert -- method --.

Signed and Sealed this
Tenth Day of September, 2024

Katherine Kelly Vidal
*Director of the United States Patent and Trademark Office*